United States Patent [19]
Fujii

[11] Patent Number: 5,159,211
[45] Date of Patent: Oct. 27, 1992

[54] EXTREME LEVEL CIRCUIT

[75] Inventor: Toshikazu Fujii, Kanagawa, Japan

[73] Assignee: Kabushiki Kaisha Toshiba, Kanagawa, Japan

[21] Appl. No.: 620,051

[22] Filed: Nov. 30, 1990

[30] Foreign Application Priority Data

Dec. 1, 1989 [JP] Japan .................. 1-313146

[51] Int. Cl.⁵ .................. H03K 5/22; H03K 5/153
[52] U.S. Cl. .................. 307/494; 307/351; 307/362
[58] Field of Search .............. 307/351, 362, 491, 494, 307/355; 330/257, 261

[56] References Cited

U.S. PATENT DOCUMENTS

| | | | |
|---|---|---|---|
| Re. 30,839 | 12/1981 | Miyamoto | 307/491 |
| 3,925,719 | 12/1975 | Rodi | 307/364 |
| 4,387,309 | 6/1983 | Shacter | 307/355 |
| 4,625,131 | 11/1986 | Kasperkovitz et al. | 307/494 |
| 4,760,286 | 7/1988 | Pigott | 307/350 |
| 4,811,100 | 3/1989 | Umezawa . | |
| 4,968,904 | 1/1990 | Yamashita et al. | 307/362 |
| 5,017,805 | 5/1991 | Kase | 307/494 |
| 5,038,055 | 8/1991 | Kinoshita | 307/491 |

FOREIGN PATENT DOCUMENTS

| | | |
|---|---|---|
| 0040275 | 11/1981 | European Pat. Off. . |
| 0130383 | 1/1985 | European Pat. Off. . |
| 58-90818 | 5/1983 | Japan . |
| 63-59595 | 11/1988 | Japan . |
| 1-122201 | 5/1989 | Japan . |

*Primary Examiner*—Eugene R. Laroche
*Assistant Examiner*—Evelyn A. Lester
*Attorney, Agent, or Firm*—Finnegan, Henderson, Farabow, Garrett and Dunner

[57] ABSTRACT

An extreme level circuit for detecting an extreme level of two input signals. The circuit includes a differential circuit wherein a pair of differential transistors are connected their emitters with each other and a common current source is connected to the emitter junction node of the differential transistors, a pair of emitter follower transistors coupled to the differential circuit for applying the input signals to the bases of the differential transistors and a pair of bias generating circuits each coupled in series with one of the emitter follower circuits, wherein each bias generating circuit has a bias transistor whose base is connected to a fixed bias source and a current source connected in series with the bias transistor, and wherein the pair of bias generating circuits are cross connected to the collectors of the differential transistors.

10 Claims, 7 Drawing Sheets

EXTREME LEVEL CIRCUIT

FIELD OF THE INVENTION

The present invention relates generally to an extreme level circuit, and more particularly to an extreme level circuit for use in processing signals.

BACKGROUND OF THE INVENTION

Extreme level circuits have been widely used in many electrical signal processing circuits. Here, the words "extreme level circuit" are used for indicating either a maximum level circuit or a minimum level circuit. For example, such a extreme level circuit has been used in an image processing apparatus.

The Japanese Laid-open Patent P63-59596 discloses a luminance and chrominance separator for TV receivers in which such conventional maximum level circuits and minimum level circuits are used for constituting an correlation detector for determining correlations between predetermined TV signals such as line signals. Further U.S. Pat. No. 4,811,100 discloses an intermediate level circuit comprising such conventional maximum level circuits and minimum level circuits.

FIGS. 1 and 2 show two typical examples of conventional extreme level circuits, i.e., a maximum level circuit and a minimum level circuit, respectively. The maximum level circuit, as shown in FIG. 1, includes two NPN transistors Tn1 and Tn2. Their collectors are coupled to a power supply voltage Vcc, while their emitters are coupled in common to a ground terminal through a resister R1. Two input signals V1 and V2 are applied to the bases of the two NPN transistors Tn1 and Tn2. A maximum level signal Vmax within the two input signals V1 and V2 is output from the node Vo connecting the emitters and the resistor R1. The minimum level circuit, as shown in FIG. 2, includes two PNP transistors Tp1 and Tp2. Their collectors are coupled to a ground terminal, while their emitters are coupled in common to a power supply voltage Vcc through a resistor R2. Two input signals V1 and V2 are applied to the bases of the two PNP transistors Tp1 and Tp2. A minimum level signal Vmin within the two input signals V1 and V2 is output from the node Vo connecting the emitters and the resistor R2. When a plurality of inputs greater than two is provided, a corresponding number of NPN or PNP transistors are coupled in parallel with each other.

However, the maximum and minimum level circuits shown in FIGS. 1 and 2 have a drawback, as will be described below. Because of these drawbacks, when the maximum and minimum level circuits are implemented in an intermediate level circuit and a correlation detector, the circuit and the detector will suffer from defects in that cross color and/or dot disturbance occurs.

FIGS. 3 and 4 are waveform diagrams for explaining the operation of the maximum level circuit of FIG. 1 and the minimum level circuit of FIG. 2. Referring to FIGS. 3 and 4, it is assumed that a sine-wave AC input signal V2 is input to one of the input terminals, while the other input terminal is fixed at a reference potential V1. Also in the FIGS. 1 and 2, DC offset voltages between the base to emitter junctions of the transistors are neglected.

As shown in FIG. 3 for the maximum level circuit, when the input signal V2 is higher than the reference level V1, the input signal V2 is output as the output signal Vo. While the input signal V2 is lower than the reference level V2, the reference level V1 is output as the output signal Vo. However, the output signal Vo is always decreased below the input signal V2 or the reference level V1. In contrast, as shown in FIG. 4 for the minimum level circuit, when the input signal V2 is higher than the reference level V1, the the reference level V1 is output as the output signal Vo. While the input signal V2 is lower than the reference level V1, the input signal V2 is output as the output signal Vo. However, the output signal Vo is always increased above the input signal V2 or the reference level V1.

These errors of the output signal Vo are caused because the transistors are not completely cutoff if they are turned OFF and undesired saturation currents then flow therethrough. This will be described in detail below by taking the maximum level circuit of FIG. 1 as an example. The emitter coupled transistors Tn1 and Tn2 constitute a differential amplifier circuit. When the input signal V2 is equal to the reference level V1, the collector currents flowing through the transistors Tn1 and Tn2 are equal and expressed by Ie/2. The output signal VO at this time is expressed by the following Equation (1):

$$Vo = V2 - VT \cdot ln(Ie/2Is) \qquad (1)$$

where VT is a thermal voltage which takes 260 mV at room temperature, Ie is the collector current of the transistor Tn2, and Is is a saturation current of the transistors.

When the input signal V2 is lower than the reference level V1; that is, V2 < V1, with a difference of about 100 mV, the transistor Tn2 is cutoff but a collector current corresponding to the saturation current Is flows through the transistor Tn1. The collector current of the transistor Tn1 at this time is Ie. Therefore, when V2 < V1, $$Vo = V1 - VT \cdot ln(Ie/Is) \qquad (2)$$

That is, when the input signal V2 is lower than the reference level V1 by a specified potential Va, e.g., about 100 mV or less, an error of [VT·ln 2] = 18 mV is produced in the output signal Vo.

When the input signal V2 is higher than the reference level V1; that is, V2 > V1, with a difference of about 100 mV, the transistor Tn1 is cutoff and a collector current corresponding to the saturation current Is flows through the transistor Tn2. The collector current of the transistor Tn2 at this time is Ie. Therefore, when V2 > V1, $$Vo = V2 - VT \cdot ln(Ie/Is) \qquad (3)$$

That is, when the input signal V2 is higher than the reference level V1 by the specified potential Va, e.g., about 100 mV or more, an error of [VT·ln2] = 18 mV is also produced in the output signal Vo.

Thus, the conventional maximum level circuit has intrinsically an error of [VT·ln2].

In FIGS. 3 and 4, the waveform of the output signal Vo was rounded at the points where the input signal V2 reaches to the reference level V1. This means that the conventional circuits do not sufficiently operate as a maximum level circuit or a minimum level circuit but instead operate with the function of an adding circuit in this region. That is, when the input signal V2 is near to the reference level V1, the level of the output signal Vo is given by the ratio of the emitter resistances of the differential transistors at a low level input signal.

Because the correlation detector and the intermediate level circuit are constructed in using the conventional maximum level circuit and the minimum level circuit, the outputs of the correlation detector and the intermediate level circuit suffer from an error component of nearly 36 mV. The insufficient efficiency of the correlation detector due to the characteristics of the conventional maximum level circuit was made inconspicuous by increasing the supply voltage is make the signal amplitude large. If the signal amplitude is 1 Vpp (peak to peak voltage), as the error component is 36 mV, the relative error component ratio becomes nearly −30 dB, which has been an allowable level.

However, a more high precise maximum level circuit is demanded at present, and because the error component level has been fixed as described above, there is no means for improving its characteristics with the exception of increasing the supply voltage. Furthermore, even when realization of a low voltage maximum level circuit was demanded, a low voltage circuit could not be realized without deterioration of its characteristics.

Further, the circuits shown in FIGS. 1 and 2 have another defect in that they produce an offset of the base to emitter voltage of the transistors.

SUMMARY OF THE INVENTION

It is, therefore, an object of the present invention to provide an extreme level circuit which is able to eliminate the problems of the conventional extreme level circuit.

Another object of the present invention is to provide an extreme level circuit which is able to produce an extreme level output signal without generating the above-described errors.

A further object of the present invention is to provide an extreme level circuit which is able to produce a highly precise extreme level output signal.

A still further object of the present invention is to provide an extreme level circuit suitable for an image processing apparatus.

In order to achieve the above object, an extreme level circuit according to one aspect of the present invention is provided with a differential circuit wherein a pair of differential transistors are connected their emitters with each other and a common current source is connected to the emitter junction node of the differential transistors, a pair of emitter follower transistors coupled to the differential circuits for applying the input signals to the bases of the differential transistors and a pair of bias generating circuits each coupled in series with one of the emitter follower circuits, wherein each bias generating circuit has a bias transistor whose base being connected to a fixed bias source and a current source connected in series with the bias transistor, and wherein the pair of bias generating circuits are cross connected to the collectors of the differential transistors.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
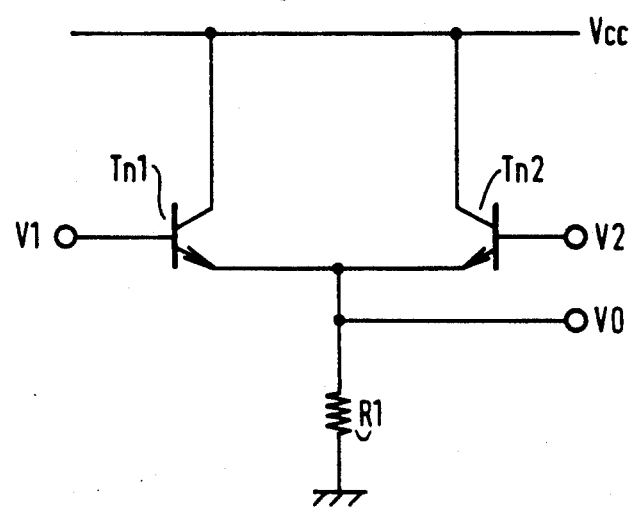
FIG. 1 is a circuit diagram showing a conventional maximum level circuit.
Figure 2:
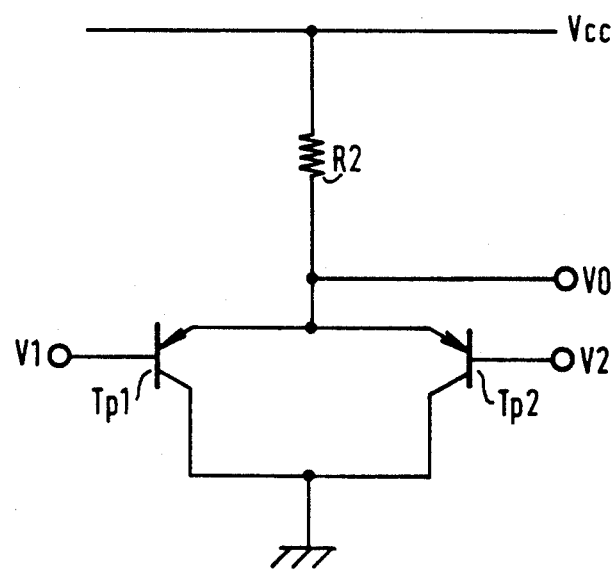
FIG. 2 is a circuit diagram showing a conventional minimum level circuit.

The present invention will be described in detail with reference to the FIGS. 5 through 14. Throughout the drawings, reference numerals or letters used in FIGS. 1 through 4 will be used to designate like or equivalent elements for simplicity of explanation.

Figure 5:
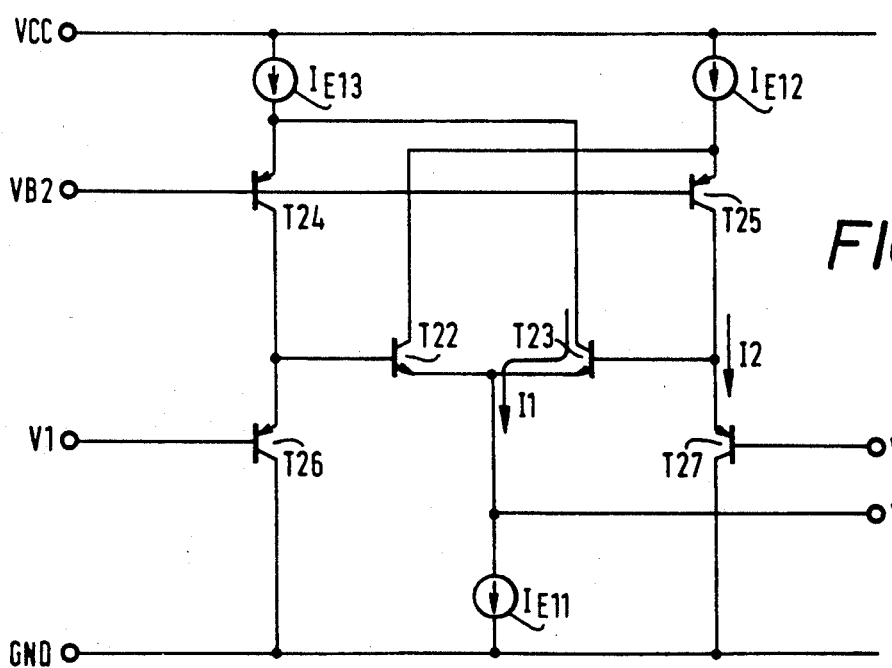
FIG. 5 is a circuit diagram showing a first embodiment of the maximum level circuit according to the present invention.

Referring now to FIG. 5, a first embodiment of the extreme level circuit according to the present invention will be described in detail. The circuit of FIG. 5 particularly shows a maximum level circuit.

In FIG. 5, a first PNP transistor T26 is connected in an emitter follower configuration between a power supply voltage Vcc and a ground potential GND through a first current source IE13 and a second PNP transistor T24. The base of the second PNP transistor T24 is coupled to a bias voltage Vb. The emitter of the first PNP transistor T26 is coupled to the base of a first differential NPN transistor T22. The first differential NPN transistor T22 is coupled to a second differential NPN transistor T23 to form a differential circuit with each other. That is, their emitters are connected in common and than coupled to the ground potential GND through a second current source IE11.

On the other hand, a third PNP transistor T27 is connected in such an emitter follower configuration between the power supply voltage Vcc and the ground potential GND through a third current source IE12 and a fourth PNP transistor T25. The base of the fourth PNP transistor T25 is also coupled to the bias voltage Vb. The emitter of the third PNP transistor T27 is coupled to the base of the second differential NPN transistor T23.

In the differential circuit, the collector of the first differential NPN transistor T22 is coupled to the third current source IE12, while the second differential NPN transistor T23 is coupled to the first current source IE13. An output of circuit is extracted from the common node of the emitters of the first and second differential NPN transistors T22 and T23.

In the construction described above, it is assumed that the current sources IE11, IE12 and IE13 supply the same amount of currents Ie1. Further it is assumed that a sine-wave AC input signal V2 is applied to the base of the third PNP transistor T27, while the base of the first PNP transistor T26 is fixed at a reference potential V1.

When the input signal V2 is equal to the reference level V1 (V2=V1), the collector currents of the transistors T22 through T27 are equal to each other and Ie½ flows. When it is assumed that the base to emitter voltage of the third PNP transistor T27 is VBE7' and that of the second differential NPN transistor T23 is VBE3", the output signal Vo is expressed by the following Equation (4);

$$Vo = V2 + VBE7' - VBE3' \qquad (4)$$
$$= V1 + VBE7' - VBE3'$$

where VBE7' and VBE3' are expressed by [VT·ln (Ie½)] thus VBE7'=VBE3' and therefore, the output signal Vo becomes equal to the reference level V1 (Vo=V1).

When the input signal V2 is higher than the reference level V1, the base potential of the second differential NPN transistor T23 rises so that the second differential NPN transistor T23 is turned ON. At this time, the current of the first current source IE11 flows through the second differential NPN transistor T23, as shown by I1. The current I1 takes the level of Ie1. Further, the current of the second current source IE12 flows to the fourth PNP transistor T25, as shown by I2, because the first differential NPN transistor T22 is OFF. The current also takes the level of Ie1. The base to emitter voltages VBE7 and VBE3 of the third PNP transistor T27 and the second differential NPN transistor T23 become equally a voltage given by [VT·ln (Ie1)]. Thus, the output signal Vo becomes equal to the input signal V2 (Vo=V2).

In the circuit as described above, the first and third PNP transistors T26 and T27 are provided to cancel the base to emitter voltages of the first and second differentially coupled NPN transistors T22 and T23. As a result, collector currents of the same amount always flow through the first NPN transistor T22 and the first PNP transistor T26, and the second NPN transistor T23 and the third PNP transistor T27. Therefore, the base to emitter voltages of the transistors T22 through T227 become the same. Thus, it becomes possible to make the output signal Vo agree with the input signal V2.

Further, this circuit does not produce a DC offset between the input signal V1 and the output signal Vo. Thus, the dynamic range is never lost.

Figure 6:
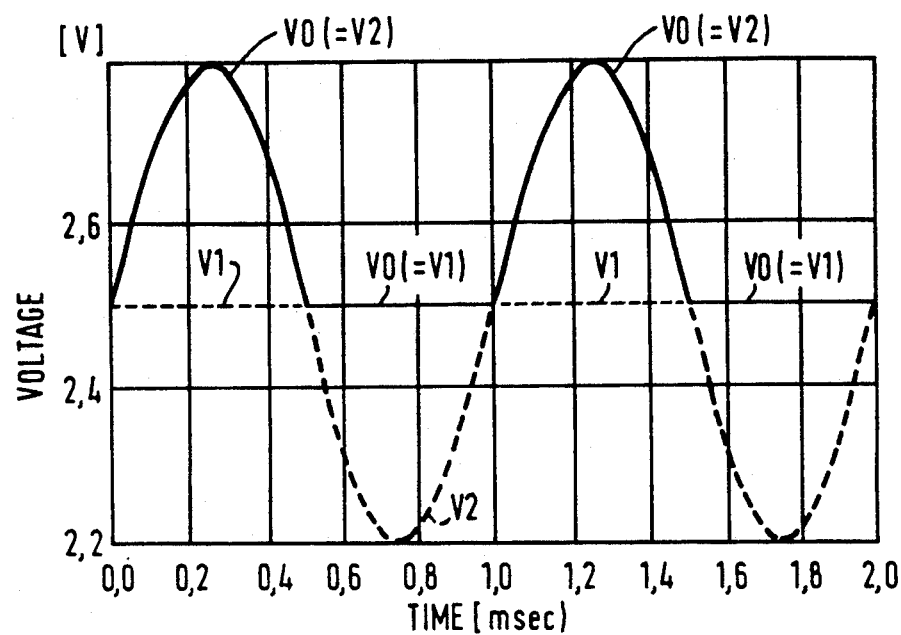
FIG. 6 is a waveform diagram for explaining the operation of the maximum level circuit of FIG. 5.

Referring now to FIG. 6, the waveform characteristics of the output signal Vo obtained according to the present invention will be described. FIG. 6 shows the waveform according to a computer simulation. In FIG. 6, the solid line graph shows the waveform of the output signal Vo. When the input signal V2 is larger than the reference level V1, the output signal Vo agrees with the input signal V2. When the input signal V2 is lower than the reference level V1, the output signal Vo agrees with the reference level V1. Thus such an error as was generated in the conventional circuits (see FIG. 3) does not occurred in this circuit.

Figure 3:
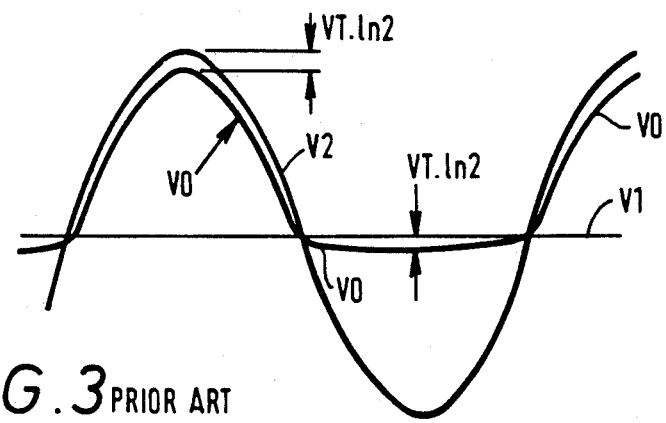
FIGS. 3 and 4 are waveform diagrams showing output signals of the conventional maximum level circuit and the minimum level circuit of FIGS. 1 and 2.
Figure 4:
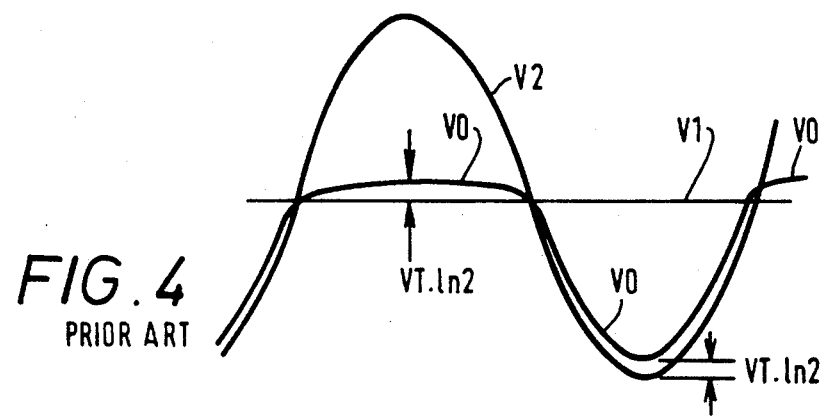

Further, the waveform of the output signal Vo according to the present invention changes sharply at portions where the input signal V2 is close to the reference level V1, in contrast to the waveform of the conventional circuit (see FIG. 3). This indicates that the circuit of the present invention can sufficiently operate as a maximum level circuit even with a low level input signal.

Figure 7:
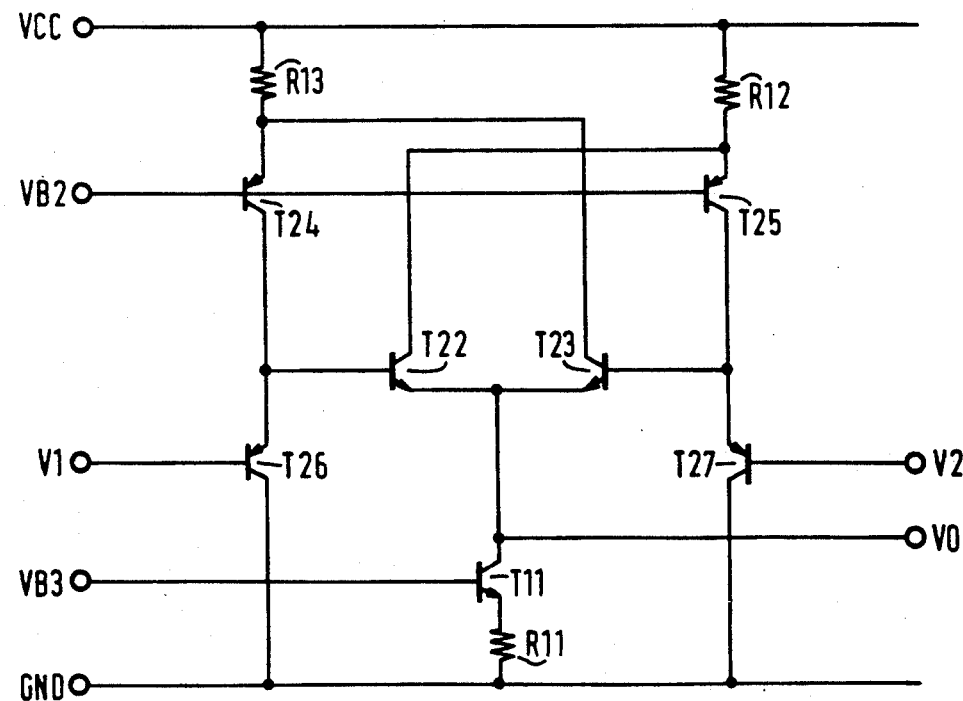
FIG. 7 is a modification of the maximum level circuit of FIG. 5.

The maximum level circuit shown in FIG. 5 can be modified as shown in FIG. 7.

In FIG. 7, the series circuit of the NPN transistor T11 and the resistor R11 corresponds to the first current source IE11. The transistor T11 is provided with a bias voltage Vb3. The resistors R13 and R12 correspond to the second and third current sources IE13 and IE12, respectively.

In the circuit of FIG. 7, the resistors R13 and R12 are not an ideal current source. As a result, the circuit of FIG. 7 is affected by fluctuations of the base to emitter voltages Vbe4 and Vbe5 of the second and fourth PNP transistors T24 and T25. Thus, the operations for cancelling the base to emitter voltages Vbe2 and Vbe3 of the first and second differential NPN transistor T22 and T23 by those of the first and third PNP transistors T26 and T27 are not perfect. However, the resulting error in the circuit of FIG. 7 is negligible in comparison to that of the conventional circuits.

For instance, it is assumed that the resistors R11 through R13 have the same resistance of 0.3 KΩ and they cause a voltage drop of 0.3 V. When the second differential NPN transistor T23 is turned OFF, the base to emitter voltage of the second PNP transistor T24 increases by about 18 mV so that the current flowing through the resistor R13, i.e., the current flowing through the first PNP transistor T26, becomes 94 μA. Further, it is assumed that the current flowing through the first differential NPN transistor T22 is set at 100 μA. Thus, the level of the output signal Vo is reduced below its intrinsic level by about 1.6 mV. However, the error voltage is less than 1/10 of the error voltage 18 mV of the conventional circuits.

Further, the circuit shown in FIG. 5 may cause a malfunction to turn T25 OFF, when the second differential NPN transistor T23 has been turned OFF. Also, the current of the current source IE13 may become larger than that of the current source IE12 due to irregularities among the currents of the current sources IE11, IE12 and IE13. In such a case, the collector current of the first differential NPN transistor T22 becomes larger than current of the current source IE12, and the fourth PNP transistor T25 is completely cut OFF and the first differential NPN transistor T22 saturates. Once the first differential NPN transistor T22 has saturated, a certain time is needed to get out of the saturation and the frequency characteristic deteriorates accordingly.

However, in the circuit of FIG. 7, the fourth PNP transistor T25 will never be completely turned OFF if an error between the resistances of the resistors R11 and R13 is negligibly small. For instance, it is assumed that a level of the current flowing through the resistor R11 is 110 μA and that flowing through the resistor R12 is 100 μA. At this time, even when the input signal V2 becomes lower below the reference level V1 to cause the current flowing through the resistor R11 to flow through the first differential NPN transistor T22, a voltage drop given by 110 μA×R12 is produced at the resistor R12 (330 mV when R12=3 kΩ) and the first differential NPN transistor T22 is never saturated. In a particular case, for instance, even when the resistance of the resistor R11 is half of the desired value, the first differential NPN transistor T22 will never be saturated.

Figure 8:
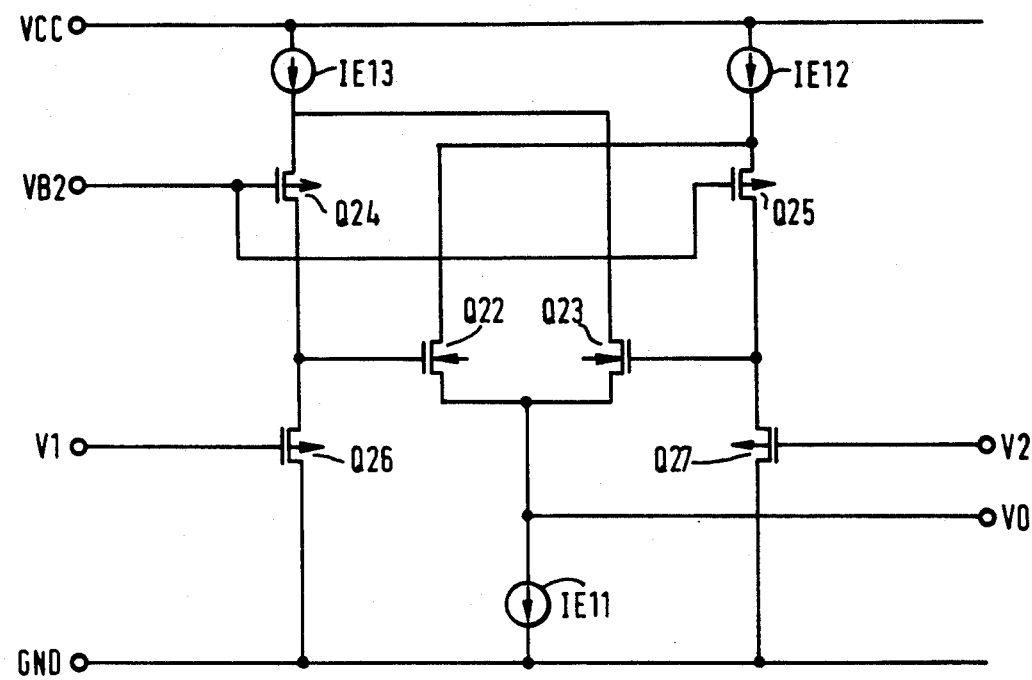
FIG. 8 is a second modification of the maximum level circuit of FIG. 5

The circuit of FIG. 5 can be modified as shown in FIG. 8. In FIG. 8, the circuit is compensated using MOS type transistors, instead of the bipolar transistors. That is, N-MOS transistors G22 and G23 of FIG. 8 correspond to the first and second NPN transistors T22 and T23 of FIG. 5, respectively. P-MOS transistors Q24 through Q27 of FIG. 8 correspond to the PNP transistors T24 through T27 of FIG. 7, respectively.

Figure 9:
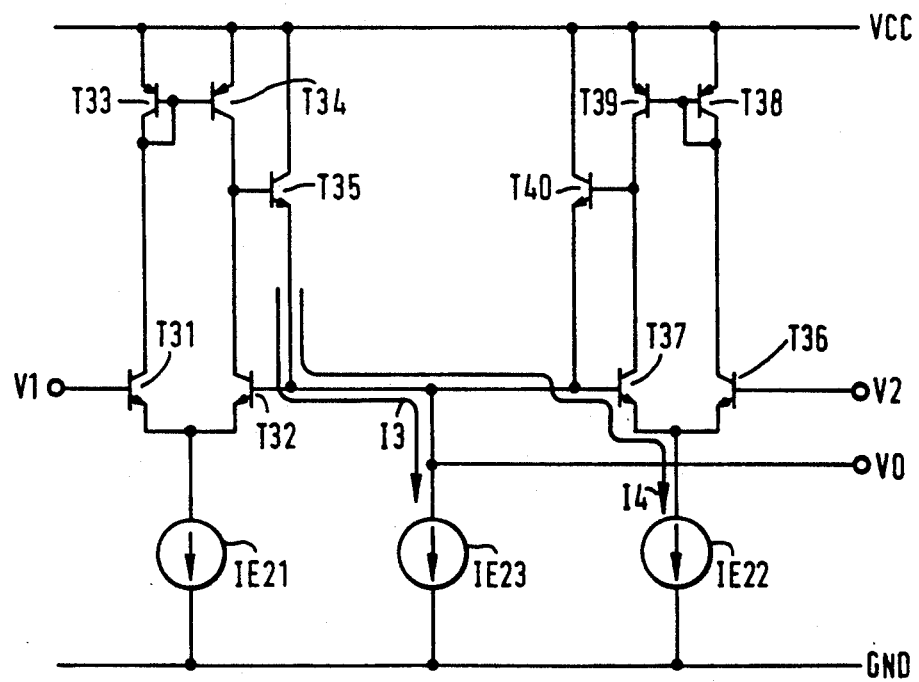
FIG. 9 is a circuit diagram showing a second embodiment of the maximum level circuit according to the present invention.

Referring now to FIG. 9, a second embodiment of the maximum level circuit according to the present invention will be described.

In FIG. 9, the maximum level circuit comprises a pair of differential circuits. The first differential circuit comprises a first and a second differential NPN transistor, T31 and T32, and a first current source IE21. That is, the emitters of the first and second differential NPN transistors T31 and T32 are connected in common and then coupled to the ground potential GND through the first current source IE21. The first differential NPN transistor T31 is provided for receiving a reference potential V1 on its base, while the second differential NPN transistor T32 is provided for coupling to the second differential circuit through its base.

The collectors of the first and second differential NPN transistors T31 and T32 are coupled to a voltage source Vcc through a first active load circuit which comprises a first and second PNP transistor, T33 and T34, connected in a current mirror configuration. The first PNP transistor T33 is connected in series with the first differential NPN transistor T31 in a configuration of diode connection. The second PNP transistor T34 is connected in series with the second differential NPN transistor T32. Their bases are then coupled with each other.

The first differential circuit further comprises a third NPN transistor T35. The third NPN transistor T35 is connected between the voltage source Vcc and the base of the second differential NPN transistor T32, while its base is connected to the collector of the second PNP transistor T34.

The second differential circuit comprises a fourth and a fifth differential NPN transistor, T36 and T37, and a second current source IE22. That is, the emitters of the fourth and fifth differential NPN transistors T36 and T37 are connected in common and then coupled to the ground potential GND through the second current source IE22. The fourth differential NPN transistor T36 is provided for receiving an input signal V2 on its base, while the fifth differential NPN transistor T37 is provided for coupling to the first differential circuit, i.e., the base of the second differential NPN transistor T32, through its base.

The collectors of the fourth and the fifth differential NPN transistors T36 and T37 are coupled to the voltage source Vcc through a second active load circuit which comprises a third and a fourth PNP transistor, T38 and T39, connected in such a current mirror configuration. The third PNP transistor T38 is connected in series with the third differential NPN transistor T36 in such a configuration of diode connection. The fourth PNP transistor T39 is connected in series with the fourth differential NPN transistor T37. Their bases are then coupled with each other.

The second differential circuit further comprises a sixth NPN transistor T40. The sixth NPN transistor T40 is connected between the voltage source Vcc and the base of the fifth differential NPN transistor T37, while its base is connected to the collector of the fourth PNP transistor T39.

Further, a third current source IE23 is connected between the common base connection coupling the first and second differential circuits together and the ground potential GND. Then an output signal Vo of the circuit is extracted from the common base connection.

In the second embodiment, the first and second differential circuits operate in the same manner when the input signal V2 is equal to the reference level V1. Thus, a person skilled in the art will easily understand the operation of the entire circuit of FIG. 9 if the operation of the first differential circuit is explained.

When the input signal V2 slightly differs from the reference level V1, the error voltage appears at the base of third NPN transistor T35. The error voltage is fed back to the first NPN differential transistor T31 through the first active load circuit. As a result, the output signal Vo becomes close to the reference level V1. Further, for instance, if the input signal V2 is sufficiently below the reference level V1 (V2<V1), the output signal Vo becomes close to the reference level V1 by the active load. Thus, the output signal Vo agrees with the reference level V1. When the input signal V2 is higher than the reference level V1 (V2>V1), the output signal Vo becomes close to the input signal V2 by action of the active load. Thus, the output signal Vo agrees with the input signal V2.

The second embodiment of the maximum level circuit according to the present invention has the following advantags. First of all, a DC offset does not markedly occur between the input signal V2 and the output signal Vo. This is because the offset between the first and second differential circuits is reduced by the gains of the first and second differential circuits.

Figure 11:
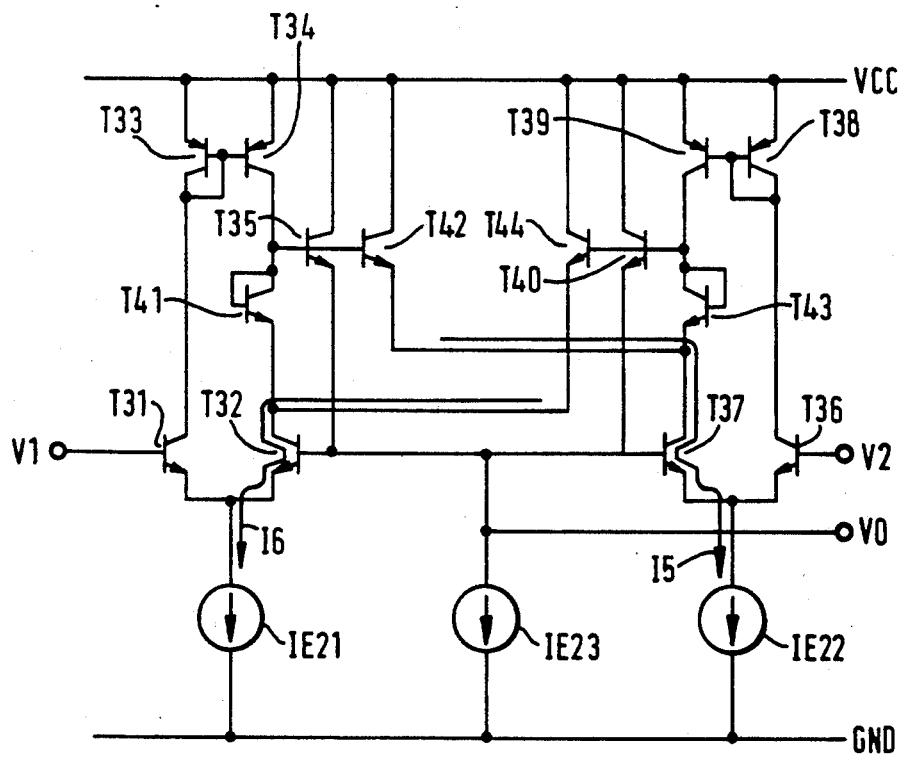
FIG. 11 is a modification of the maximum level circuit of FIG. 9.

As to the second advantage, the circuit of FIG. 9 serves to reduce the error of [VT·ln 2]. For the third advantage, the waveform of the output signal Vo almost changes sharply at portions where the input signal V2 is close to the reference level V1, similar to the first embodiment (see FIG. 8). As a result, the output signal Vo can almost follow the input signal V1 and the reference level V1, as shown in FIG. 11.

However, when the frequency of input signal V1 is relatively high, the frequency response is deteriorated so that the waveform becomes round due to the following reason.

When the input signal V2 is lower than the reference level V1 (V2<V1), the second differential circuit is turned OFF. Thus the current of the current source IE23 flows through the third NPN transistor T35. The current is indicated as I3 in FIG. 9. On the other hand, the sixth NPN transistor T4 is turned OFF because the second differential circuit is deactivated due to the low level input signal V2. Therefore, the base voltage of the sixth NPN transistor T40 drops to cause the fifth NPN transistor T37 to be saturated. As a result, the current of the current source IE22 flows through the current path through the third NPN transistor T35 as indicated by I4. Even when the input signal V2 becomes higher than the reference level V1 (V2>V1) in this state, the output signal Vo cannot quickly follow the change of the input signal V2.

Figure 10:
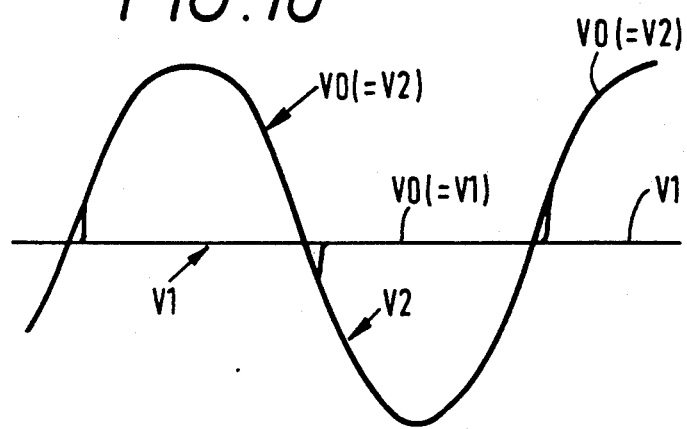
FIG. 10 is a waveform diagram for explaining the operation of the maximum level circuit of FIG. 9.

In order for the output signal Vo to follow the input signal V2, it is necessary that the fifth NPN transistor T37 gets out of saturation so that a current flows through the fourth PNP transistor T39 and fifth NPN transistor T37 in series, and the base potential of the sixth NPN transistor T40 rises to effect the feedback operation of the second active load circuit. A voltage of about 1.4 V is needed as a base potential for the sixth NPN transistor T40. For reaching the required base potential, a period of about 100 nsec is taken even when the through rate of the second differential circuit is 14 V/μsec. In addition, another period is taken until the fourth differential NPN transistor T37 gets out of the saturation. Therefore, for short periods $\tau$, as shown in FIG. 10, after the input signal V2 has reached the reference level V1, the output signal Vo fails to follow the input signal V2 or the reference level V1. Thus, the output signal Vo follows the other signal, e.g., the reference level V1 or the input signal V2 for the periods $\tau$.

Referring now to FIG. 11, an improvement of the second embodiment will be discussed.

As shown in FIG. 11, the modification of the second embodiment includes in addition four NPN transistors, i.e., seventh to tenth NPN transistors T41 through T44. The seventh NPN transistor T41 is connected between the second PNP transistor T34 and the second differential NPN transistor T32 in such a configuration of the diode connection. The ninth NPN transistor T43 is connected between the fourth PNP transistor T39 and the fifth differential NPN transistor T37 also in the configuration of the diode connection. The eighth NPN transistor T42 is connected between the voltage source Vcc and the collector of the fifth differential NPN transistor T37, while its base is connected to the collector of the second PNP transistor T34 together with the third NPN transistor T35. The tenth NPN transistor T44 is connected between the voltage source Vcc and the collector of the second differential NPN transistor T32, while its base is connected to the collector of the fourth PNP transistor T39 together with the sixth NPN transistor T40.

In the construction described above, the fifth differential NPN transistor T37 is prevented from the saturating during the state of V2<V1. Also the second differential NPN transistor T32 is prevented from the saturating during the state of V2>V1. That is, when in the state of V2<V1, the current of the current source IE22 flows through the collector to emitter path of the eighth NPN transistor T42 and the collector to emitter path of fifth differential NPN transistor T37, as indicated by I5 in FIG. 11. When the state has changed to the other state, i.e., the state of V2>V1, the base potential of sixth NPN transistor T40 rises less then the base to emitter voltage of ninth NPN transistor T43 from the circuit shown in FIG. 9 to cause the second differential circuit to be turned ON. Therefore, the second active load circuit operates in a shorter time than the circuit in FIG. 9.

When in the state of V2>V1, the current of the current source IE21 flows through the collector to emitter path of the tenth NPN transistor T44 and the collector to emitter path of second differential NPN transistor T32, as indicated by I6 in FIG. 11. When the state has changed to the other state, i.e., the state of V2<V1, the base potential of third NPN transistor T35 rises less by the base to emitter voltage of seventh NPN transistor T41 from the circuit shown in FIG. 9 to cause the first differential circuit to turn ON from the OFF state. Therefore, the first active load circuit also operates in a shorter time than the circuit in FIG. 9.

When in the state of V2=V1, both the first and second differential circuits operate similarly so that the currents I5 and I6 simultaneously flow. As a result, a relatively small offset occurs between the first and second differential circuits due to irregularities of the base to emitter voltages of the differential NPN transistors T31, T32, T36 and T37. However, the offset can be easily reduced because the base to emitter voltages of the differential NPN transistors T31, T32, T36 and T37 can be set small in comparison to the conventional circuits. For example, each of the differential NPN transistors T31, T32, T36 and T37 can be constructed in multi-transistor configuration in which a plurality of transistors are parallelly connected with each other. When the circuit is implemented on IC circuits, the reduction of the base to emitter voltages is accomplished by enlarging the emitter areas of the differential NPN transistors T31, T32, T36 and T37. Also in the state of V2=V1, the currents flowing through eighth and tenth NPN transistors T42 and T44 become very small so that both the base to emitter voltages of the fourth and fifth differential NPN transistors T36 and T37 become nearly equal to each other. And also both the base to emitter voltages of the first and second differential NPN transistors T31 and T32 become nearly equal to each other. Therefore, the fifth and second differential NPN transistors T37 and T32 are prevented from saturation.

Figure 12:
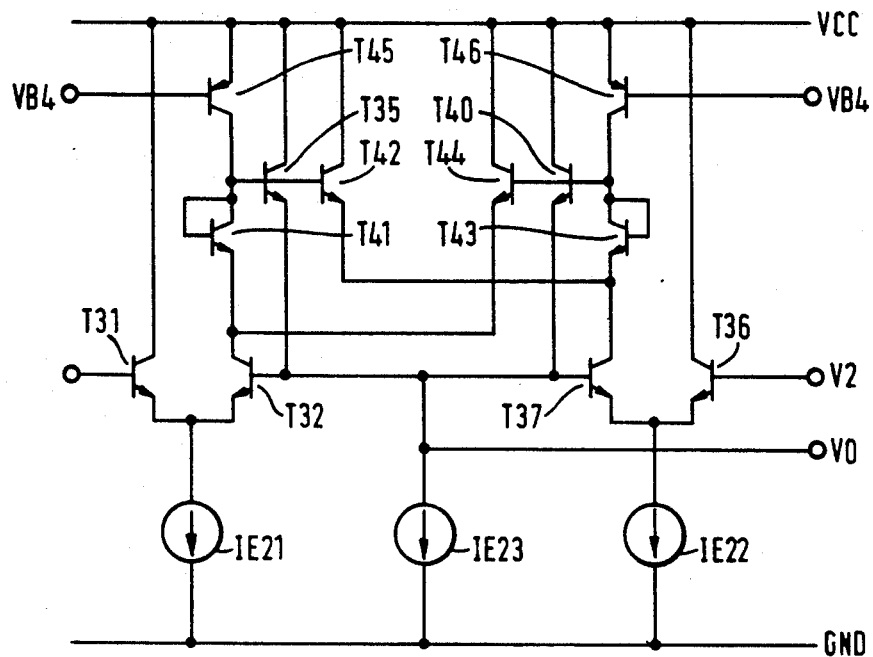
FIG. 12 is another modification of the maximum level circuit of FIG. 9.

Referring now to FIG. 12, another improvement of the second embodiment will be discussed. The circuit of FIG. 12 improves the response after the input signal V2 has reached the reference level V1.

In this modification, a load circuit for each of the first and second differential circuits comprises a bias circuit. For example, the bias circuit of the load circuit for the first differential circuit comprises a fifth PNP transistor T45 which is connected between the power source Vcc and the second differential NPN transistor T32 together with the seventh NPN transistor T41. The base of the fifth PNP transistor T45 is connected to a fixed bias source Vb4. Similarly, the bias circuit of the load circuit for the second differential circuit comprises a sixth PNP transistor T46 which is connected between the power source Vcc and the fifth differential NPN transistor T37 together with the ninth NPN transistor T43. The base of the sixth PNP transistor T46 is also connected to the fixed bias source Vb4.

In the circuit of FIG. 11, a base bias of about 0.7 v is needed for activating the sixth NPN transistor T40 and the third NPN transistor T35. However, in the transition period during which they reach the base bias there is a fear of causing an undesired change in the output signal Vo.

According to the modification shown in FIG. 12, the fifth and sixth PNP transistors T45, T46 are always biased in ON states thus for causing all their currents to flow into the seventh and ninth NPN transistors T41, T43, regardless whether the differential circuits are in ON state or OFF state. Thus, the seventh and ninth NPN transistors T41, T43 always provide fixed voltages to the third and sixth NPN transistors T35, T40 for keeping them in ON states. Thus, such an undesired change in the output signal Vo can be avoided, after the input signal V2 has reached to the reference level V1.

Figure 13:
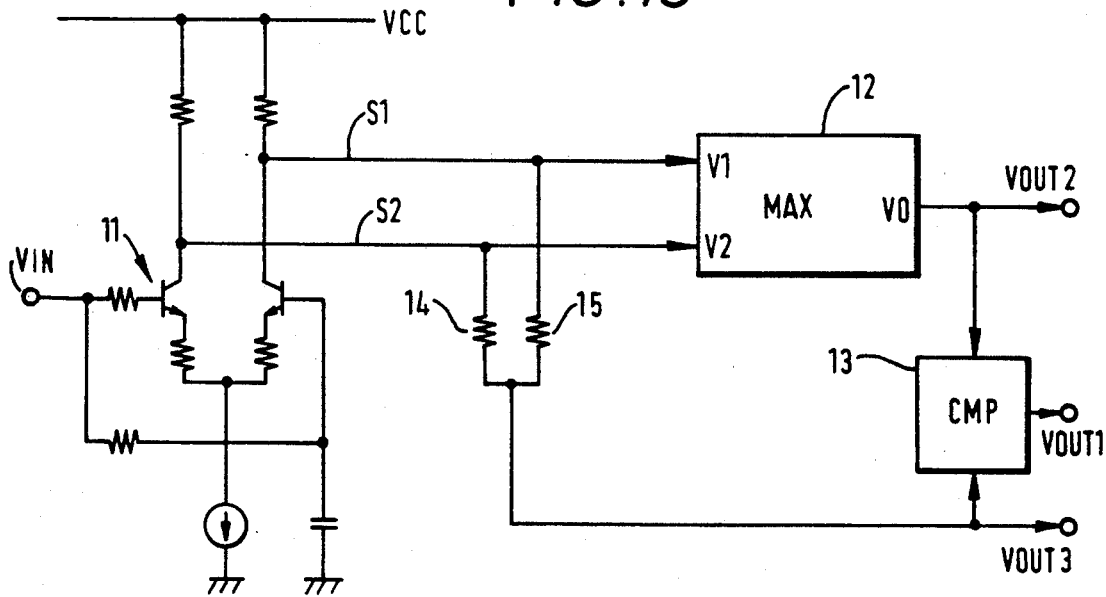
FIG. 13 is a circuit diagram showing utilization of the maximum level circuit.

Referring now to FIG. 13, the maximum level circuit according to the embodiment of the present invention can be applied to a novel construction of a full wave rectifier circuit.

In FIG. 13, the full wave rectifier circuit comprises a differential circuit 11, a maximum level circuit 12 which is constructed in accordance with the present invention, and a comparator (CMP) 13. The differential circuit 11 produces two differential signals S1 and S2 based on an input signal Vin. These differential signals S1 and S2 are applied to the maximum level circuit 12 as its two inputs V1 and V2. The maximum level circuit 12 extracts the maximum level in the two inputs V1 and V2, i.e., the differential signals S1 and S2, as described above. Thus, an output signal Vo of the maximum level circuit 12 is derived as a full wave rectification signal Vout2. However, the full wave rectification signal Vout2 output from the maximum level circuit 12 includes itself a DC component, because the differential signals S1 and S2 are often offset.

The differential signals S1 and S2 obtained by the differential circuit 11 are further combined in a resistor circuit comprising resistors 14 and 15 and produce an output signal Vout3. This output signal Vout3 represents a DC error component between the differential signals S1 and S2. The DC error component corresponds to the DC component of the full wave rectification signal Vout2.

The full wave rectification signal Vout2 and the DC error component Vout3 are compared to each other by the comparator 13. Thus in the comparator 13, the output signal Vout3 cancels the DC component of the full wave rectification signal Vout2. As a result, another full wave rectification signal Vout1, which is compensated for the DC component, is output.

When the comparator 13 has a predetermined offset voltage, the comparator 13 outputs the output Vout1 only when the input signal Vin exceeds the offset voltage. As a result, the circuit of FIG. 13 in which the comparator 13 is offset is usable as a level detection circuit.

Figure 14:
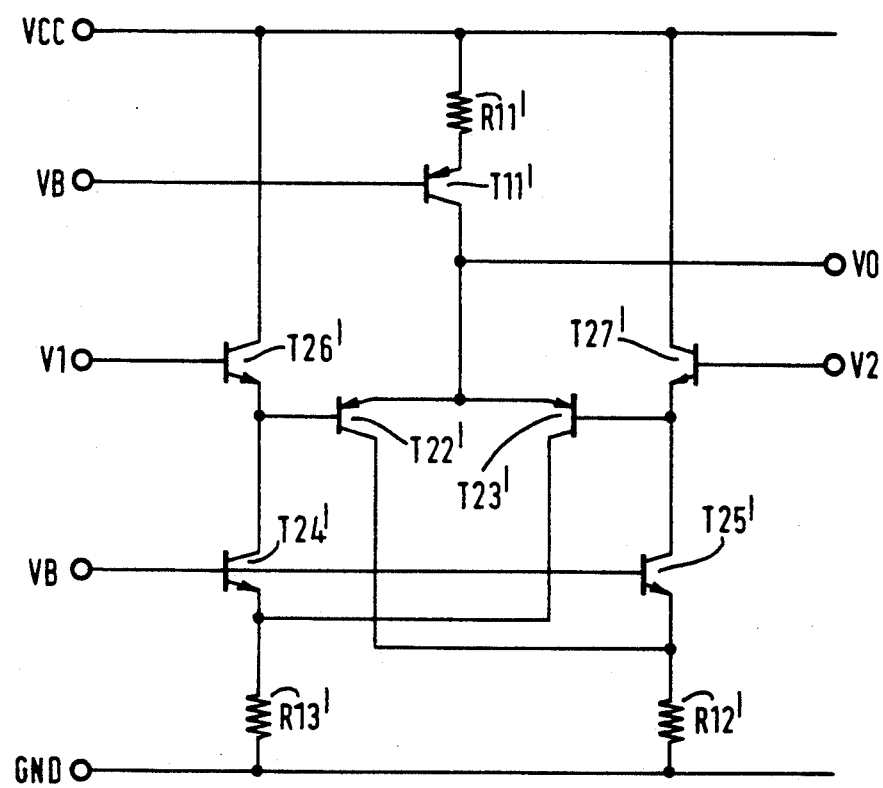
FIG. 14 is a circuit diagram showing an embodiment of the minimum level circuit according to the present invention.

Referring now to FIG. 14, another embodiment of the extreme level circuit according to the present invention will be described in detail. The circuit of FIG. 14 particularly shows the extreme level circuit specified in a minimum level circuit.

The minimum level circuit of FIG. 14 is constructed in the complementary circuit configuration to the maximum level circuit of FIG. 7. That is, the minimum level circuit of FIG. 14 can be accomplished by substituting the active elements T11, T22 through T27 for those of opposite conductivity types. That is, in FIG. 14, PNP transistors T11', T22' and T23' are used in place of the NPN transistors T11, T22 and T23 in FIG. 7. Also in FIG. 14, NPN transistors T24' through T27' are used in place of the PNP transistors T24 through T27 in FIG. 7.

According to the above construction, it is understood that the minimum level circuit of FIG. 14 can extract a minimum level of two input signals V1 and V2 without producing any DC offset between the input signals and the output signal Vo.

It is also understood that the minimum level circuit of FIG. 14 may be modified, in similar ways to the circuits of FIGS. 8, 9, 10 and 12.

When a correlation detector is constructed by using the maximum level circuit and the minimum level circuit as described above, the error which is a problem in the prior art can be reduced to 3.2 mV, which is a largely improved level because it was about 36 mV in the conventional circuit.

As described above, the present invention can provide an extremely preferable extreme level circuit, i.e., such as the maximum level circuits and minimum level circuits.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. An extreme level circuit for detecting an extreme level of two input signals, comprising:
    a differential circuit wherein a pair of differential transistors are connected their emitters with each other and a common current source is connected to the emitter junction node of the differential transistors;
    a pair of emitter follower transistors coupled to the differential circuit for applying the input signals to the bases of the differential transistors; and
    a pair of bias generating circuits each coupled in series with one of the emitter follower circuits, wherein each bias generating circuit has a bias transistor whose base being connected to a fixed bias source and a current source connected in series with the bias transistor;
    and wherein the pair of bias generating circuits are cross connected to the collectors of the differential transistors.

2. An extreme level circuit of claim 1, wherein the current source in each of the bias generating circuits includes a resistor.

3. An extreme level circuit of claim 1, wherein the extreme level circuit includes bipolar transistors for the differential transistors, emitter follower transistors and the bias generating transistors.

4. An extreme level circuit of claim 1, wherein the extreme level circuit includes field effect transistors for the differential transistors, emitter follower transistors and the bias generating transistors.

5. An extreme level circuit for detecting an extreme level of two input signals, comprising:
    a first differential circuit wherein a first differential transistor connected its base to one of the input signals and a second differential transistor are connected their emitters with each other and a first current source is connected between a first reference potential source and the emitter junction node of the first and second differential transistors;
    a first active load circuit which is connected between a second reference potential source and the collectors of the first and second differential transistors of the first differential circuit;
    a second differential circuit wherein a third differential transistor connected its base to the other of the input signals and a fourth differential transistor connected its base to the base of the second differential transistor are connected their emitters with each other and a second current source is connected to the first reference potential source and the emitter junction node of the third and fourth differential transistors;

a second active load circuit which is connected between the second reference potential source and the collectors of the third and fourth differential transistors of the second differential circuit;

a third current source connected between the first reference potential source and the base junction node of the second and fourth differential transistors;

a first feedback transistor connected its base-emitter path in parallel with the collector-base path of the second differential transistor and its collector to the second reference potential source; and a second feedback transistor connected its base-emitter path in parallel with the collector-base path of the fourth differential transistor and its collector to the second reference potential source.

6. An extreme level circuit of claim 5, wherein each of the first and second active load circuits include a current mirror circuit.

7. An extreme level circuit of claim 5, wherein each of the first and second active load circuits include a bias transistor having a base connected to a fixed bias source.

8. An extreme level circuit of claim 5, further comprising:

a first cross feedback transistor connected its base to the base of the first feedback transistor and its collector-emitter path between the second reference potential source and the collector of the fourth differential transistor; and a second cross feedback transistor connected its base to the base of the second feedback transistor and its collector-emitter path between the second reference potential source and the collector of the second differential transistor.

9. An extreme level circuit of claim 8, wherein each of the first and second active load circuits include a current mirror circuit.

10. An extreme level circuit of claim 8, wherein each of the first and second active load circuits include a bias transistor having a base connected to a fixed bias source.

* * * * *

UNITED STATES PATENT AND TRADEMARK OFFICE
CERTIFICATE OF CORRECTION

PATENT NO. : 5,159,211

DATED : October 27, 1992

INVENTOR(S) : FUJII

It is certified that error appears in the above-identified patent and that said Letters Patent is hereby corrected as shown below:

Claim 1, col. 12, lines 27-28, change "are connected their emitters with each other" to --having emitters connected to each other--;

Claim 1, col. 12, line 37, change "whose base being" to --having a base--.

Claim 5, col. 12, lines 58-59, change "are connected their emitters with each other" to --having emitters connected to each other--;

Claim 5, col. 12, line 68, change "connected its base" to --having a base connected--;

Claim 5, col. 13, line 2, change "connected its base" to --having a base connected--;

Claim 5, col. 13, lines 3-4, change "are connected their emitters with each other" to --having emitters connected to each other--;

Claim 5, col. 13, lines 17-18 and 22-23, change "connected its base-emitter path" to --having a base-emitter path connected--.

UNITED STATES PATENT AND TRADEMARK OFFICE
CERTIFICATE OF CORRECTION

PATENT NO. : 5,159,211
DATED : October 27, 1992
INVENTOR(S) : FUJII

It is certified that error appears in the above-indentified patent and that said Letters Patent is hereby corrected as shown below:

Claim 8, col. 14, lines 9 and 14, change "connected its base" to --having a base connected--.

Signed and Sealed this

Fourteenth Day of December, 1993

Attest:

BRUCE LEHMAN

Attesting Officer    Commissioner of Patents and Trademarks